United States Patent
Liu et al.

(10) Patent No.: US 12,089,398 B2
(45) Date of Patent: Sep. 10, 2024

(54) METHOD FOR MANUFACTURING MEMORY

(71) Applicant: CHANGXIN MEMORY TECHNOLOGIES, INC., Hefei (CN)

(72) Inventors: Zhongming Liu, Hefei (CN); Longyang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 547 days.

(21) Appl. No.: 17/411,098

(22) Filed: Aug. 25, 2021

(65) Prior Publication Data

US 2022/0320106 A1 Oct. 6, 2022

Related U.S. Application Data

(63) Continuation of application No. PCT/CN2021/106117, filed on Jul. 13, 2021.

(30) Foreign Application Priority Data

Mar. 30, 2021 (CN) .......................... 202110343663.3

(51) Int. Cl.
 *H10B 12/00* (2023.01)
(52) U.S. Cl.
 CPC ....... *H10B 12/482* (2023.02); *H10B 12/0335* (2023.02); *H10B 12/053* (2023.02); *H10B 12/34* (2023.02)
(58) Field of Classification Search
 CPC .... H10B 12/482; H10B 12/053; H10B 12/34; H10B 12/0335; H10B 12/315
 See application file for complete search history.

(56) References Cited

U.S. PATENT DOCUMENTS

| 8,198,189 B2 * | 6/2012 | Kim ................... H10B 12/0335 |
| | | 438/619 |
| 9,397,145 B1 | 7/2016 | Sills et al. |

(Continued)

FOREIGN PATENT DOCUMENTS

| CN | 103367283 A | 10/2013 |
| CN | 106941097 A | 7/2017 |

(Continued)

OTHER PUBLICATIONS

Supplementary European Search Report in the European application No. 21881352.5 mailed on Dec. 19, 2022, 8 pgs.

(Continued)

*Primary Examiner* — Kyoung Lee
*Assistant Examiner* — Sophia W Kao
(74) *Attorney, Agent, or Firm* — Kilpatrick Townsend & Stockton LLP

(57) ABSTRACT

A method for manufacturing a memory is provided. The method comprises: providing a substrate comprising a plurality of active areas disposed at intervals, and the active area comprising a first contact area and second contact areas; forming a plurality of bit lines disposed at intervals on the substrate; forming a first isolation layer on the bit line, the first isolation layer forming a first trench; etching the bottom of the first trench along the first trench to form a second trench exposing the second contact area; forming a first conductive layer in the first trench and the second trench; removing part of the first conductive layer to form a plurality of first through holes, so that the first conductive layer is separated into a plurality of conducting wires, and each conducting wire being connected to a second contact area; and forming a second isolation layer in the first through hole.

17 Claims, 19 Drawing Sheets

(56) References Cited

U.S. PATENT DOCUMENTS

| | | | | |
|---|---|---|---|---|
| 9,419,000 B2* | 8/2016 | Kim | ................. | H01L 23/53295 |
| 9,620,451 B2* | 4/2017 | Hwang | ............. | H01L 21/76877 |
| 9,865,602 B2* | 1/2018 | Kwon | ................. | H10B 12/053 |
| 10,607,996 B1* | 3/2020 | Sasaki | ............... | H01L 21/76829 |
| 10,923,390 B2* | 2/2021 | Yoon | ................. | H10B 12/0335 |
| 10,923,480 B2* | 2/2021 | Surthi | ............... | H01L 23/53257 |
| 10,930,655 B2* | 2/2021 | Kim | ................. | H10B 12/0335 |
| 11,074,965 B2 | 7/2021 | Wang et al. | | |
| 11,764,107 B2* | 9/2023 | Choi | ................ | H01L 21/76816 |
| | | | | 257/774 |
| 2016/0079260 A1* | 3/2016 | Bae | ................. | H01L 21/31058 |
| | | | | 438/586 |
| 2019/0103302 A1 | 4/2019 | Yoon | | |
| 2020/0203213 A1 | 6/2020 | Yoon | | |
| 2020/0212043 A1 | 7/2020 | Sasaki | | |
| 2021/0027832 A1 | 1/2021 | Wang et al. | | |
| 2021/0312975 A1 | 10/2021 | Wang et al. | | |

FOREIGN PATENT DOCUMENTS

| | | | |
|---|---|---|---|
| CN | 108493188 A | 9/2018 |
| CN | 109003938 A | 12/2018 |
| CN | 111640744 A | 9/2020 |

OTHER PUBLICATIONS

International Search Report in the international application No. PCT/CN2021/106117, mailed on Dec. 29, 2021, 2 pgs.

* cited by examiner

Part of an intermediate layer and part of a first isolation layer are removed to form fourth trenches extending along a second direction, and a first conductive layer and the first isolation layer are exposed in the fourth trenches — S1061

The first conductive layer located at the bottom of the fourth trenches is removed to form a plurality of first through holes — S1062

METHOD FOR MANUFACTURING MEMORY

CROSS-REFERENCE TO RELATED APPLICATIONS

The application is a continuation of International Patent Application No. PCT/CN2021/106117, filed on Jul. 13, 2021, which is based on and claims priority to Chinese Patent Application No. 202110343663.3, filed to the China National Intellectual Property Administration on Mar. 30, 2021 and entitled "Method for Manufacturing Memory". The disclosures of International Patent Application No. PCT/CN2021/106117 and Chinese Patent Application No. 202110343663.3 are hereby incorporated by reference in their entireties.

BACKGROUND

With the continuous development of a semiconductor technology and a storage technology, an electronic device is continuously developing towards miniaturization and integration. A Dynamic Random Access Memory (DRAM) is widely applied in various electronic devices because of its relatively high storage density and relatively rapid read-write speed.

The DRAM may generally include a substrate, the substrate is provided with a plurality of active areas, a plurality of bit lines disposed at intervals are disposed on the substrate, and the active area of each row makes contact with a bit line. An isolation layer is also disposed on the substrate and the bit line, the isolation layer is provided with a plurality of through holes, the plurality of through holes and the active areas are in one-to-one correspondence, each of the through holes exposes an active area, and the bit line is not exposed in the through hole. In related arts, during manufacturing of a memory, after the through holes are formed, the substrate is usually etched along the through holes, so as to form grooves, the groove and the through hole are filled with a conducting wire, and thus a capacitor is electrically connected with the active area by the conducting wire.

However, in a process of forming the grooves, the isolation layer outside the bit line is easy to etch through, which results in that the conducting wire filled in the groove is conducted with the bit line, thereby causing failure of the memory and the relatively low yield of the memory.

SUMMARY

The present disclosure relates to the technical field of storage devices, and in particular, to a method for manufacturing a memory.

The embodiments of the present disclosure provide a method for manufacturing a memory, which may include: a substrate is provided, the substrate may include a plurality of active areas disposed at intervals, and the active area may include a first contact area and second contact areas; a plurality of bit lines disposed at intervals are formed on the substrate, and each of the bit lines is connected to at least one first contact area; first isolation layers are formed on the bit lines, and a first trench extending along a first direction is formed between the two adjacent first isolation layers; the bottom of the first trench is etched along the first trench to form a second trench, the bottom of the second trench is located in the substrate, and the second contact area is exposed in the second trench; a first conductive layer is formed in the first trench and the second trench; part of the first conductive layer is removed to form a plurality of first through holes, the first conductive layer is separated into a plurality of conducting wires by the plurality of first through holes, and each of the conducting wires is connected to a respective second contact area; and a second isolation layer is formed in the first through hole.

DETAILED DESCRIPTION

Figure 1:
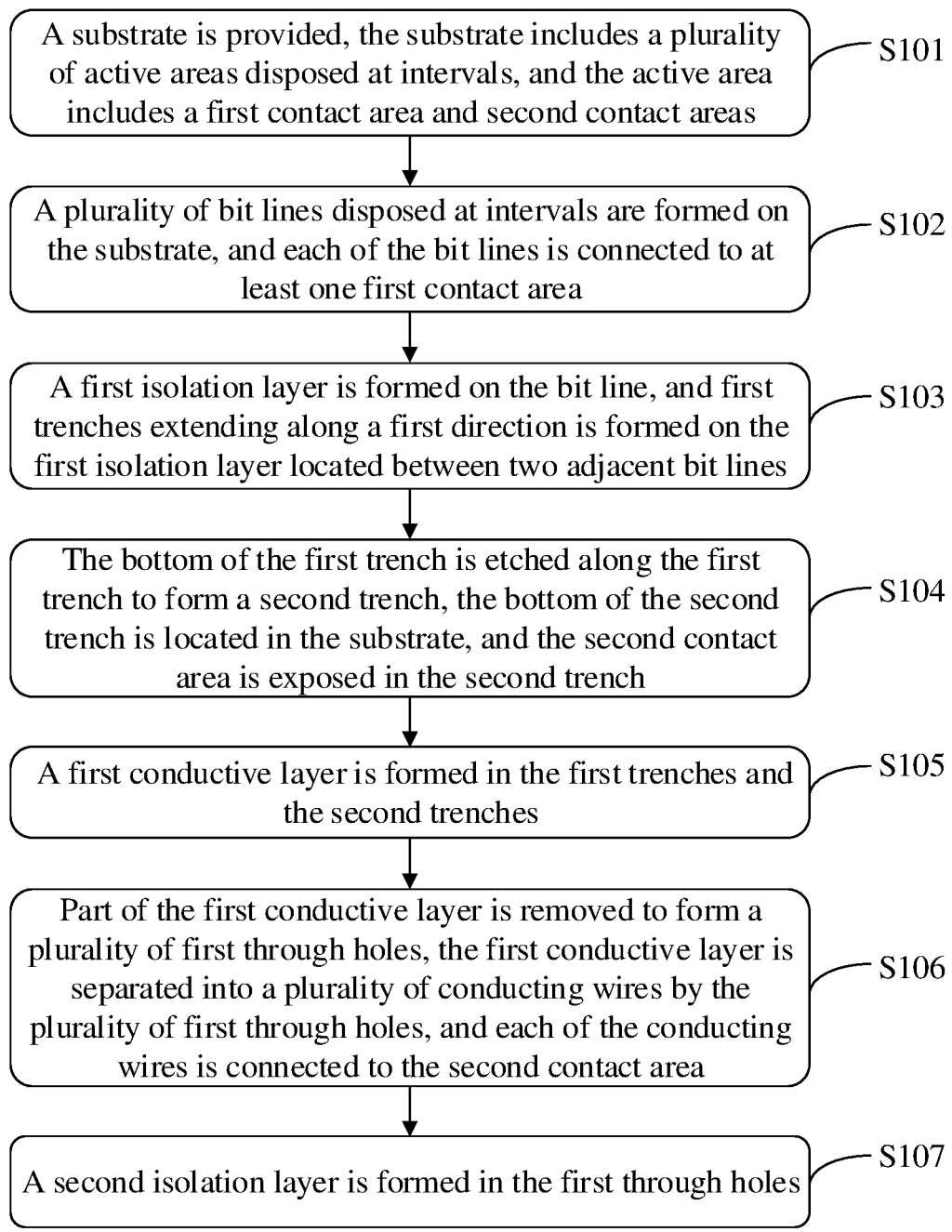
FIG. 1 is a flowchart of a method for manufacturing a memory according to an embodiment of the present disclosure.

In a related technology, during manufacturing of a memory, a plurality of bit lines and a first isolation layer covering the various bit lines are usually formed on a substrate at first; the substrate may include a plurality of active areas disposed at intervals, the active area may include a first contact area and second contact areas, each bit line is connected to at least one first contact area, and the first isolation layer between two adjacent bit lines forms a first trench; an intermediate layer is deposited in the first trench, and fully fills in the first trench; the intermediate layer is etched to form a first through hole, the retained intermediate layer forms a plurality of columnar structures disposed at intervals, and each of the columnar structures corresponds to a second contact area; a second isolation layer is deposited in the first through hole; the retained intermediate layer is removed to form a second through hole; the substrate is etched along the second through hole, so as to form a groove, and the groove exposes the second contact area; and a conducting wire is filled in the groove and the second through hole.

In the above manufacturing process, when the substrate is etched along the second through holes, the first isolation layer outside the bit line is easy to etch through, which results in that the conducting wire is conducted with the bit line, thereby causing failure of the memory and the relatively low yield of the memory. Moreover, the intermediate layer is removed by etching twice, the removing process is complex, and residue of the intermediate layer also causes the relatively low yield of the memory.

In order to solve the technical problem of the relatively low yield of the memory, the embodiments of the present disclosure provide a method for manufacturing a memory, at first, the bottom of a first trench is etched along the first trench formed in a first isolation layer to form a second trench, the bottom of which is located in a substrate, the second trench exposes an active area of the substrate, and then a first conductive layer is formed in the first trench and the second trench, so as to reduce the filling difficulty of the first conductive layer; a first through hole is formed in the first conductive layer, the retained first conductive layer forms a conducting wire, a second isolation layer is filled in the first through hole, etching is not required again after the second isolation layer is formed, so that the through etching possibility of the first isolation layer is reduced, and the yield of the memory is improved.

In order to make the above objectives, features and advantages of the embodiments of the present disclosure more obvious and understandable, the technical solutions in the embodiments of the present disclosure will be clearly and completely described below in combination with the drawings in the embodiments of the present disclosure. It is apparent that the described embodiments are not all embodiments but merely part of embodiments of the present disclosure. On the basis of the embodiments of the present disclosure, all other embodiments obtained by those of ordinary skilled in the art without creative work shall fall within the scope of protection of the present disclosure.

Referring to FIG. 1, the embodiments of the present disclosure provide a method for manufacturing a memory, which may specifically include the following steps.

At S101, a substrate is provided, the substrate may include a plurality of active areas disposed at intervals, and the active area may include a first contact area and second contact areas.

Figure 2:
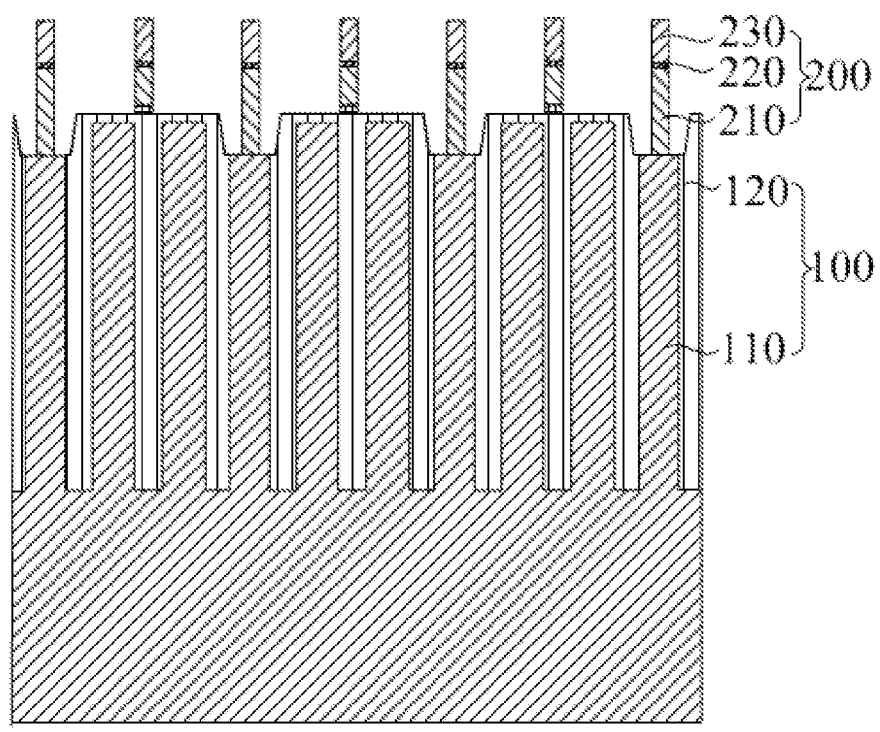
FIG. 2 is a sectional view after bit lines are formed according to an embodiment of the present disclosure.

Referring to FIGS. 2 to 5, an active area 110 is disposed in the substrate 100. Referring to FIG. 2, the active area 110 is not exposed to the surface of the substrate 100. There may be a plurality of active areas 110, which are disposed at intervals. Exemplarily, a Shallow Trench Isolation (STI) structure 120 is disposed among the plurality of active areas 110, and silicon oxide ($SiO_2$) is disposed in the STI structure 120, so that the plurality of active areas 110 are isolated from each other.

The plurality of active areas 110 may be disposed in an array. Each of the active areas 110 may include a first contact area 111 and second contact areas 112, and the first contact area 111 and the second contact areas 112 are connected adjacently. The first contact area 111 is connected to a bit line 200, and the second contact area 112 is connected to a capacitor, for example, the second contact area 112 is connected to the capacitor through a conducting wire and a capacitive contact pad in sequence.

Figure 4:
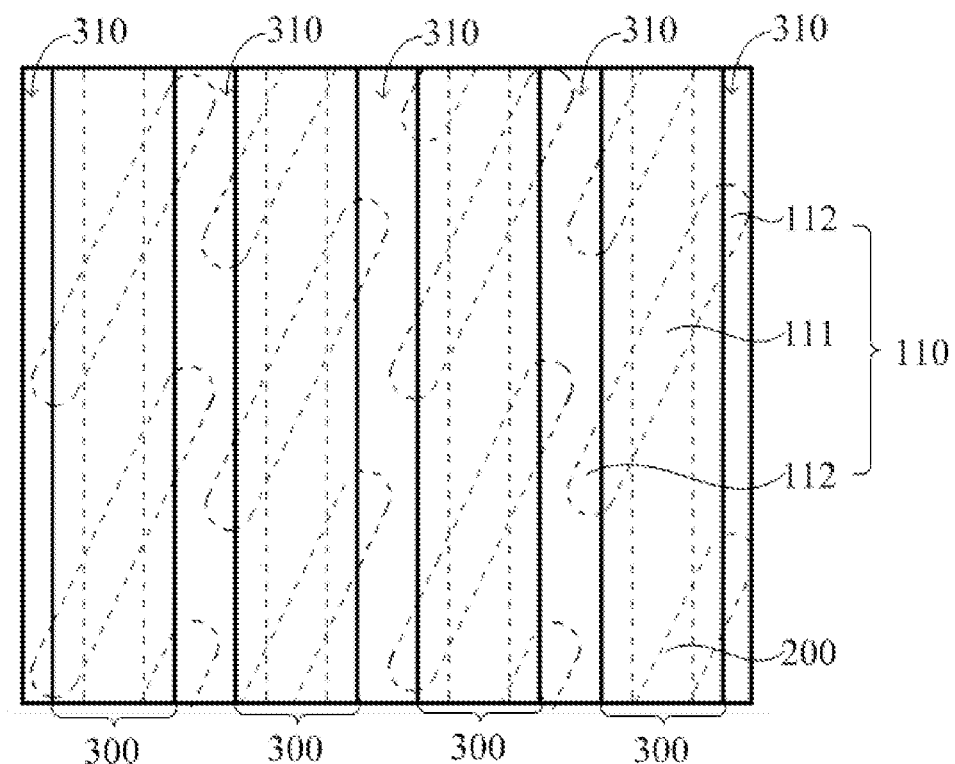
FIG. 4 is a top view after a first isolation layer is formed according to an embodiment of the present disclosure.

In a possible example, as illustrated in FIG. 4, the first contact area 111 is located in the center of the active area 110, the second contact areas 112 are located at two sides of the active area 110, that is, the second contact areas 112 are located at both sides of the first contact area 111 respectively, and the material of the active area 110 may include silicon (Si).

At S102, a plurality of bit lines disposed at intervals are formed on the substrate, and each of the bit lines is connected to at least one first contact area.

Figure 3:
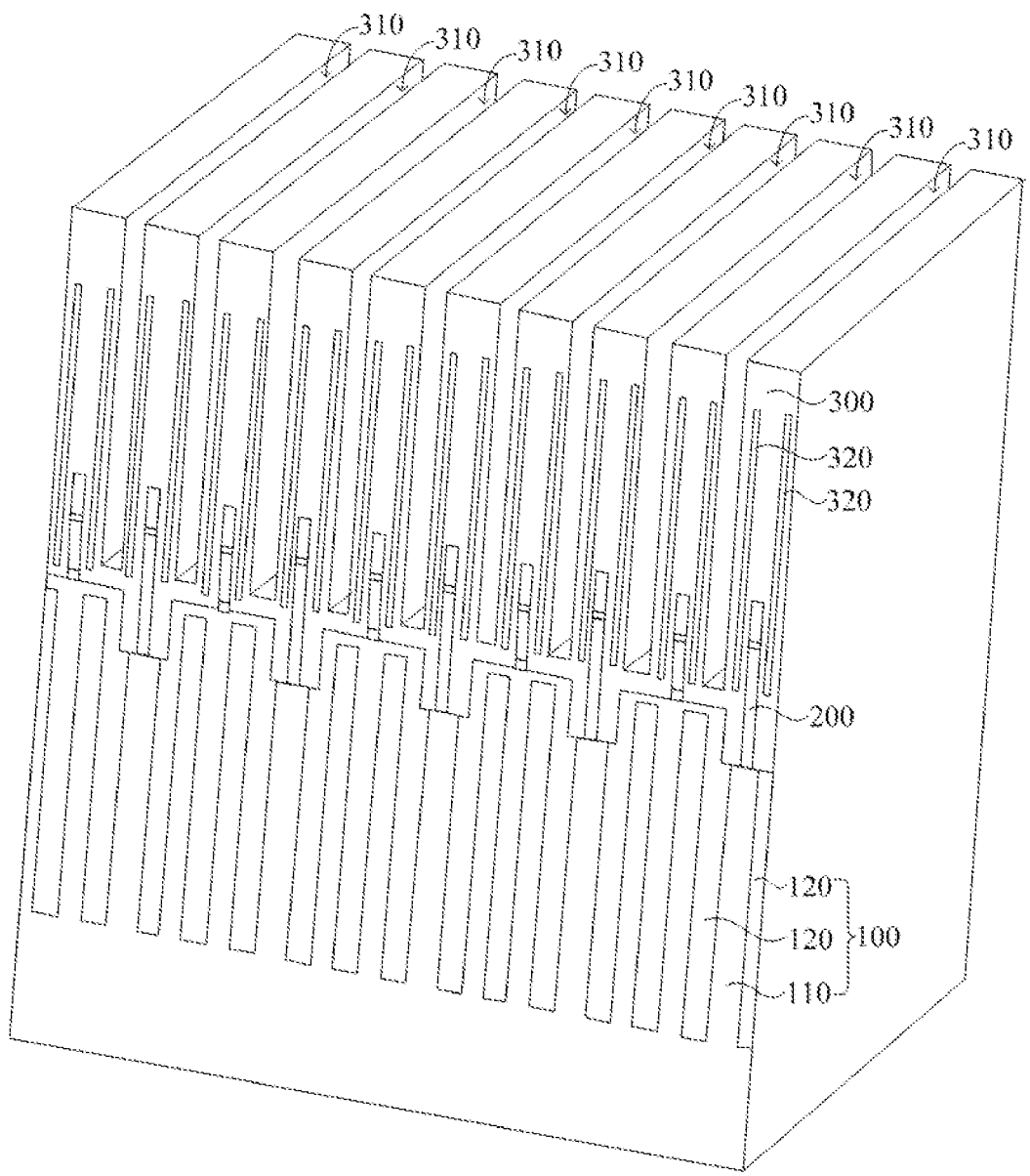
FIG. 3 is a solid diagram after a first isolation layer is formed according to an embodiment of the present disclosure.
Figure 5:
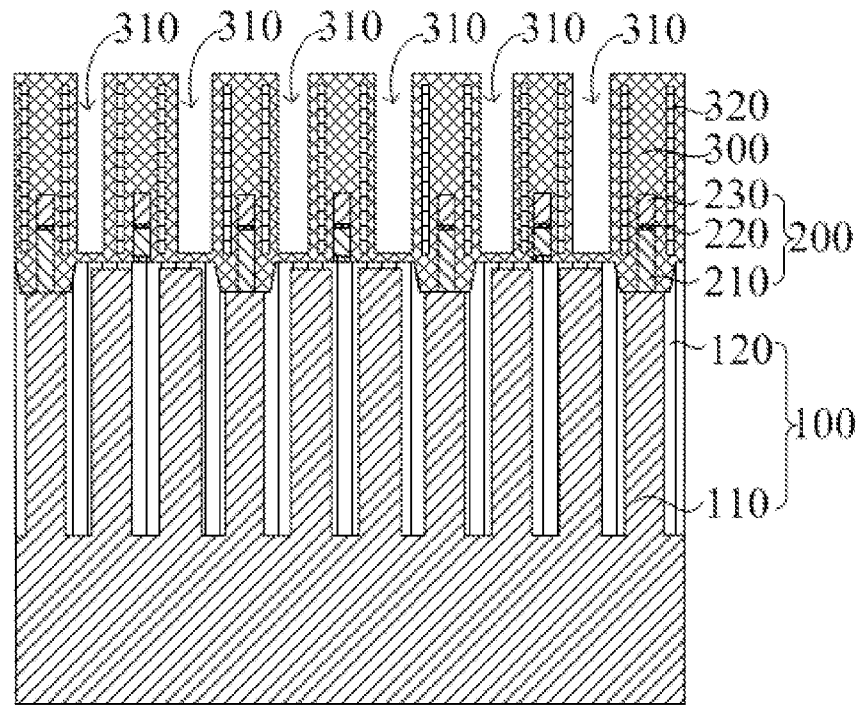
FIG. 5 is a sectional view after a first isolation layer is formed according to an embodiment of the present disclosure.

Referring to FIGS. 3 to 5, the plurality of bit lines 200 disposed at intervals are formed on the substrate 100, a bit line contact window may be formed in the substrate 100, the first contact area 111 of the active area 110 is exposed in the bit line contact window, and each of the bit lines 200 is connected to at least one first contact area 111 through the bit line contact window. For example, each of the bit lines 200 is connected to the first contact areas 111 of the plurality of active areas 110 in the same row, that is, the first contact areas 111 of the plurality of active areas 110 in the same row may be connected to the same bit line 200, and each of the first contact areas 111 is only connected to a bit line 200.

It is to be understood that, there is a certain angle between an orthographic projection of the bit line 200 on the substrate 100 and an orthographic projection of the active area 110 on the substrate 100, that is, the two orthographic projections are not parallel. Exemplarily, in the orientation as illustrated in FIG. 4, the bit line 200 is vertically arranged, the plurality of bit lines 200 are parallel to each other, the active area 110 is disposed to be inclined, and the plurality of active areas 110 are parallel to each other. The same bit line 200 may pass through the plurality of active areas 110.

As illustrated in FIGS. 3 to 5, the bit line 200 may include a second conductive layer 210, a third conductive layer 220 and a fourth conductive layer 230, which are stacked in sequence, and the fourth conductive layer 230 is located on the substrate 100, and is electrically connected with the active area 110 of the substrate 100.

Exemplarily, the material of the second conductive layer 210 may include polycrystalline silicon, the material of the third conductive layer 220 may include titanium nitride (TiN), and the material of the fourth conductive layer 230 may include tungsten (W).

At S103, first isolation layers are formed on the bit line, and a first trench extending along a first direction is formed between two adjacent first isolation layers.

Also referring to FIGS. 3 to 5, after the bit lines 200 are formed, the first isolation layer 300 is formed on the bit lines 200, and the first isolation layer 300 covers the bit lines 200. It is to be understood that, the first isolation layer 300 is formed on an upper surface and a side surface of each of the bit lines 200, and the material of the first isolation layer 300 may be an insulating material, such as silicon nitride ($Si_3N_4$), so as to perform protection and electric isolation on the bit lines 200.

The first trench 310 is formed between two adjacent first isolation layers 300, that is, two side walls of the first trench 310 are the first isolation layers 300. As illustrated in FIG. 3, the first trench 310 extends along a first direction, and it is to be understood that, the extending direction of the first trench 310 is the same as the extending direction of the bit line 200.

In a possible example, as illustrated in FIG. 3 and FIG. 5, a plurality of first sacrificial layers 320 may also be disposed in the first isolation layer 300, and in a section vertical to the bit line 200 as illustrated in FIG. 5, both sides of each of the bit lines 200 are provided with a first sacrificial layer 320. The first sacrificial layer 320 extends along a first direction, that is, the extending direction of the first sacrificial layer 320 is the same as the extending direction of the bit line 200.

The material of the first sacrificial layer 320 may include an oxide, such as $SiO_2$. It is to be understood that, along the direction from the bit line 200 to the first trench 310, a Nitride, an Oxide and a Nitride (NON) are sequentially formed outside the bit line 200.

Figure 6:
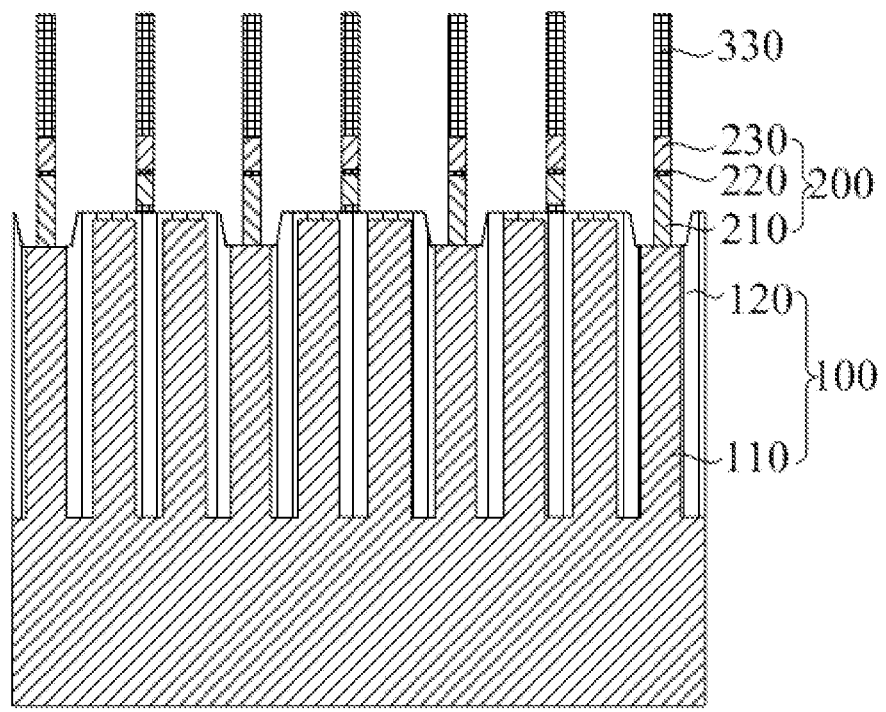
FIG. 6 is a sectional view after a first nitride layer is formed according to an embodiment of the present disclosure.
Figure 7:
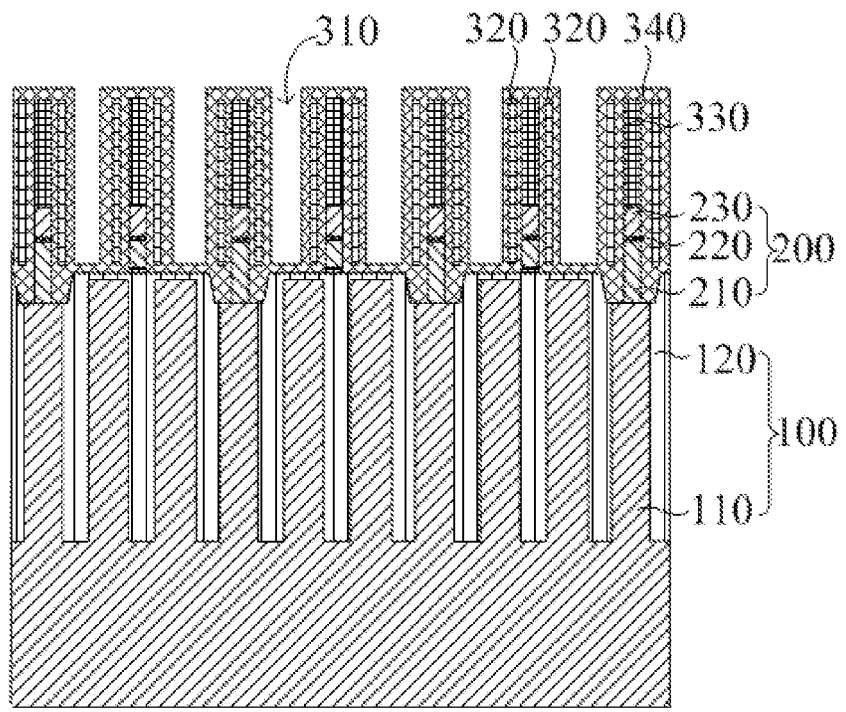
FIG. 7 is a sectional view after a second nitride layer is formed according to an embodiment of the present disclosure.

In some possible examples, referring to FIG. 6 and FIG. 7, the first isolation layer 300 may be formed through the following steps.

A first nitride layer 330 is formed on a side wall and a top surface of the bit line 200. For example, as illustrated in FIG. 6, a second preset conductive layer, a third preset conductive layer, a fourth preset conductive layer and a first preset nitride layer are sequentially formed on the substrate 100, the second preset conductive layer, the third preset conductive layer, the fourth preset conductive layer and the first preset nitride layer are etched, so as to form the second conductive layer 210, the third conductive layer 220, the fourth conductive layer 230 and the first nitride layer 330 as illustrated in FIG. 6, and the second conductive layer 210, the third conductive layer 220 and the fourth conductive layer 230 form the bit line 200.

After the first nitride layer 330 is formed, the first sacrificial layer 320 and a second nitride layer 340 are formed, as illustrated in FIG. 7, the formed first sacrificial layer 320 is located at two sides of the bit line 200 and the first nitride layer 330, and the second nitride layer 340 covers the first sacrificial layer 320, the first nitride layer 330 and the bit line 200.

At S104, the bottom of the first trench is etched along the first trench to form a second trench, the bottom of the second trench is located in the substrate, and the second contact area is exposed in the second trench.

Figure 8:
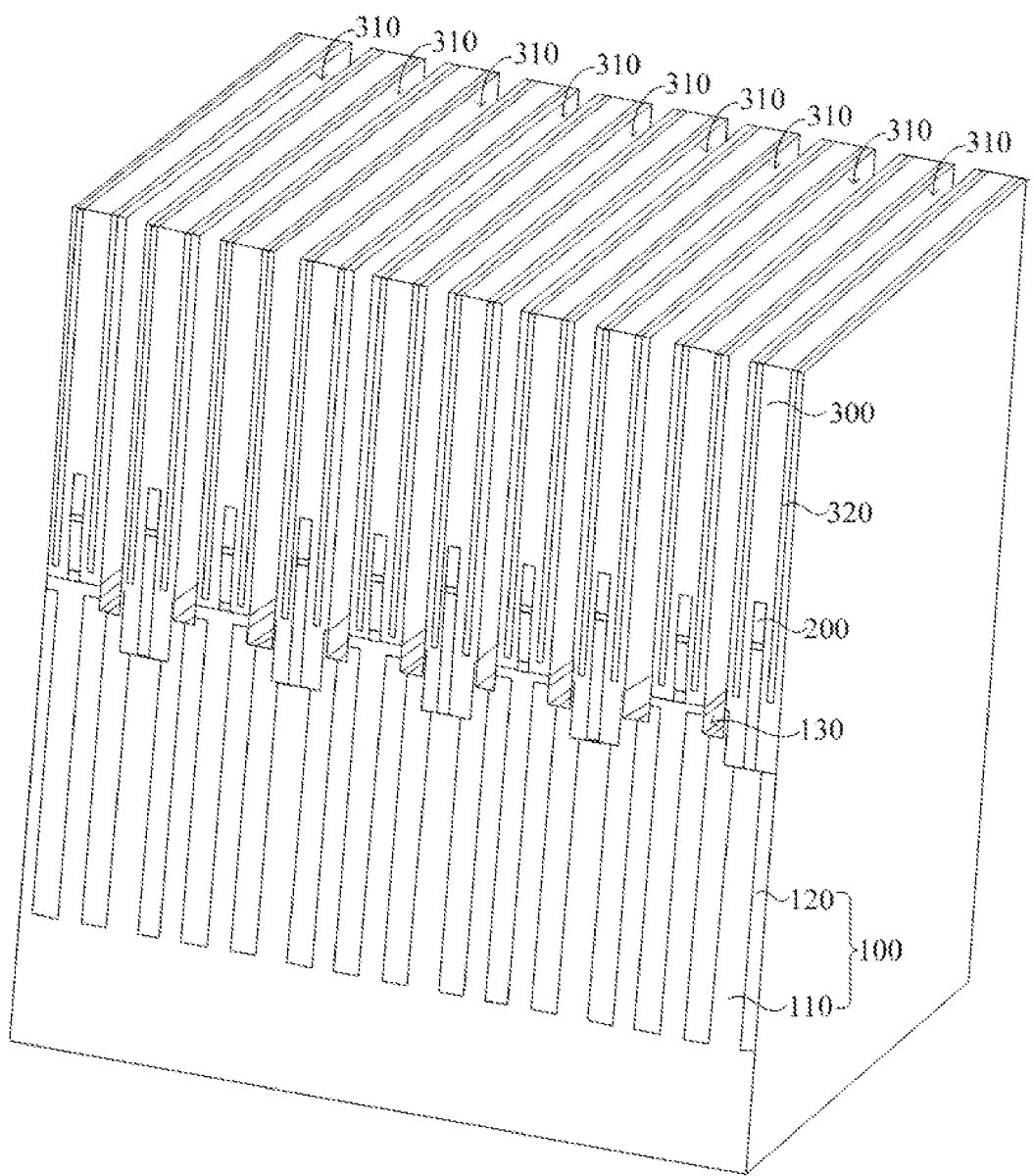
FIG. 8 is a solid diagram after second trenches are formed according to an embodiment of the present disclosure.
Figure 9:
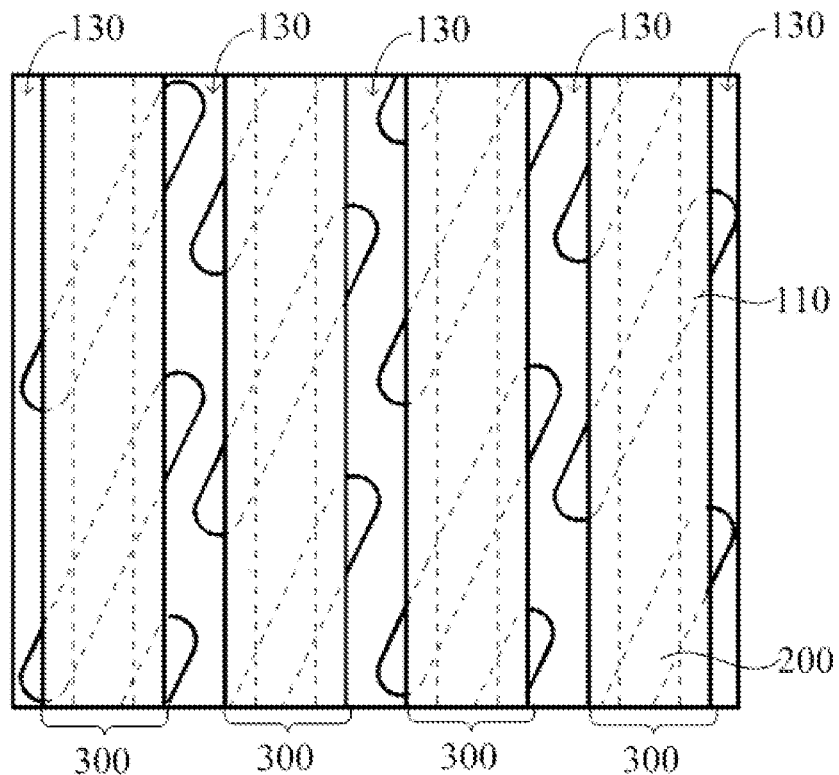
FIG. 9 is a top view after second trenches are formed according to an embodiment of the present disclosure.
Figure 10:
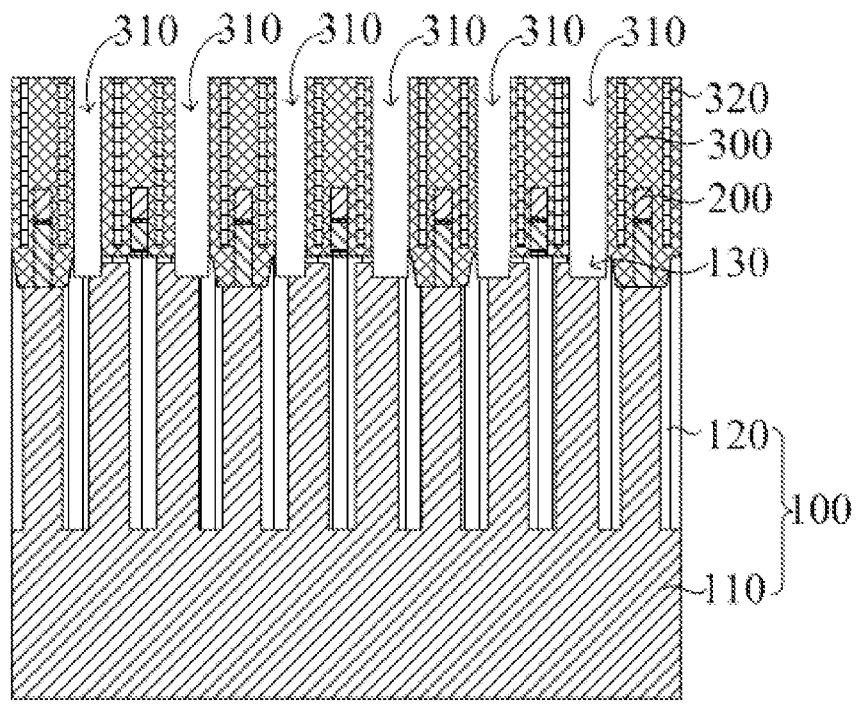
FIG. 10 is a sectional view after second trenches are formed according to an embodiment of the present disclosure.

Referring to FIGS. 8 to 10, the bottom of the first trench 310 is etched along the first trench 310, so as to form the second trench 130, and the bottom of the second trench 130 is located in the substrate 100 as illustrated in FIG. 8. The depth of the second trench 130 is relatively small, so that the loading effect is reduced, and thus the second trench 130 is conveniently formed. Meanwhile, the alignment problem of a through hole and an overlay mark in the active area 110 in a related technology may also be avoided.

Referring to FIG. 9, the second contact area 112 is exposed in the second trench 130, the active area 110 as illustrated in FIG. 9 has a partial solid line and a partial dotted line, the solid line shows the second contact area 112 exposed in the second trench 130, and the dotted line shows the first contact area 111 shielded by the first isolation layer 300, or the first contact area 111 shielded by the first isolation layer 300 and part of the second contact area 112.

In a possible example, the first trench 310 exposes the substrate 100, when the bottom of the first trench 310 is etched along the first trench 310, the substrate 100 is etched, the second trench 130 is formed in the substrate 100, and the second trench 130 exposes the second contact area 112 of the active area 110.

In another possible example, the first isolation layer 300 covers the bit line 200 and the substrate 100, that is, the first isolation layer 300 is exposed in the first trench 310, when the bottom of the first trench 310 is etched along the first trench 310, the first isolation layer 300 and the substrate 100 are etched, so as to form the second trench 130, as illustrated in FIG. 10, the bottom of the first isolation layer 300 is located in the substrate 100, and the second trench 130 exposes the second contact area 112 of the active area 110.

In the above examples, referring to FIG. 10, the first sacrificial layer 320 is also disposed in the first isolation layer 300, when the first isolation layer 300 and the substrate 100 are etched along the first trench 310, part of the first isolation layer 300 is also removed, so that the first sacrificial layer 320 is exposed to the surface, away from the substrate 100, of the first isolation layer 300, and thus, the first sacrificial layer 320 is conveniently removed subsequently, thereby forming first air gaps. As illustrated in FIG. 10, part of an area above the first isolation layer 300 is removed, so that the first sacrificial layer 320 is exposed to the upper surface of the first isolation layer 300.

At S105, a first conductive layer 400 is formed in the first trench 310 and the second trench 130.

Figure 11:
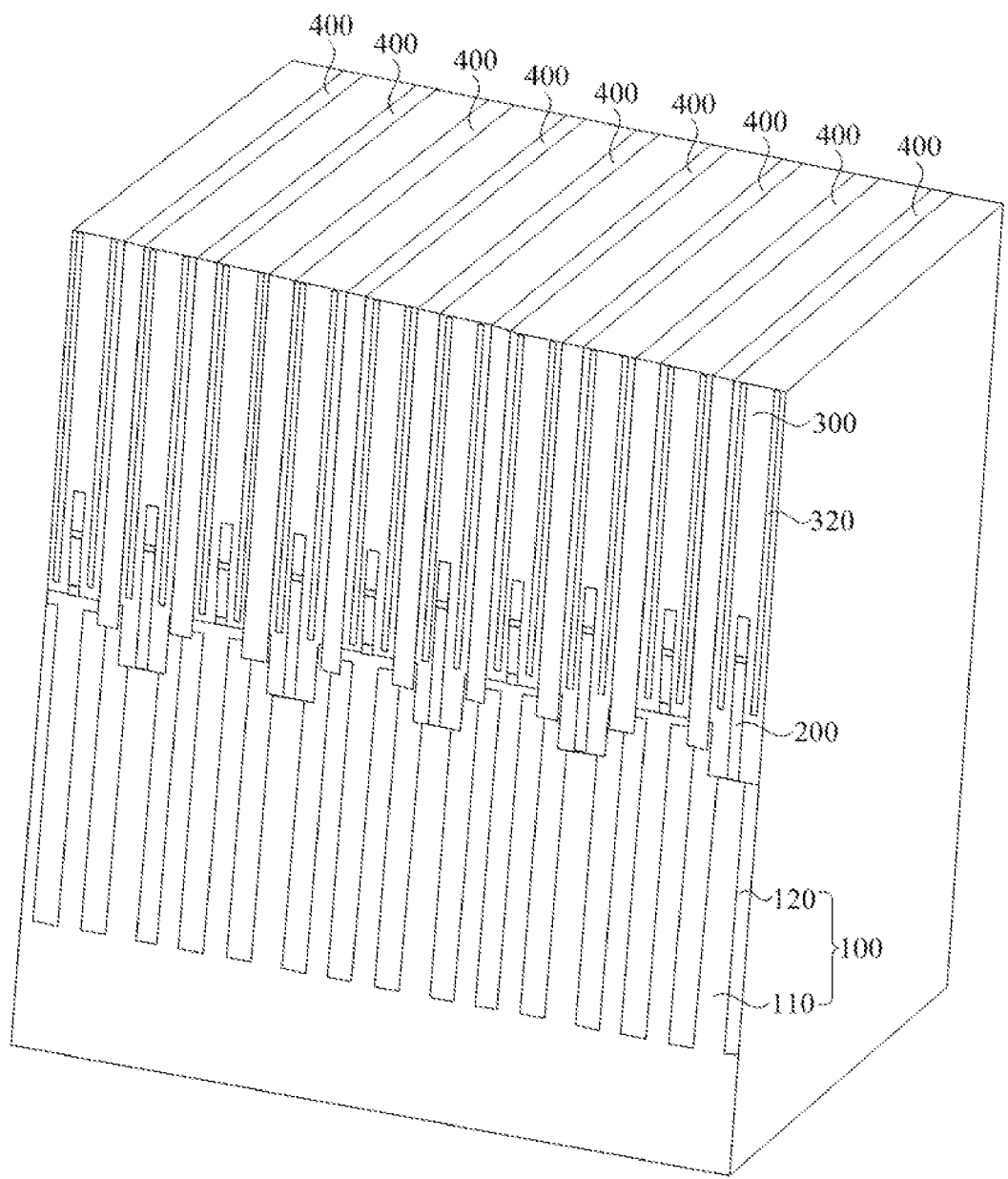
FIG. 11 is a solid diagram after a first conductive layer is formed according to an embodiment of the present disclosure.
Figure 12:
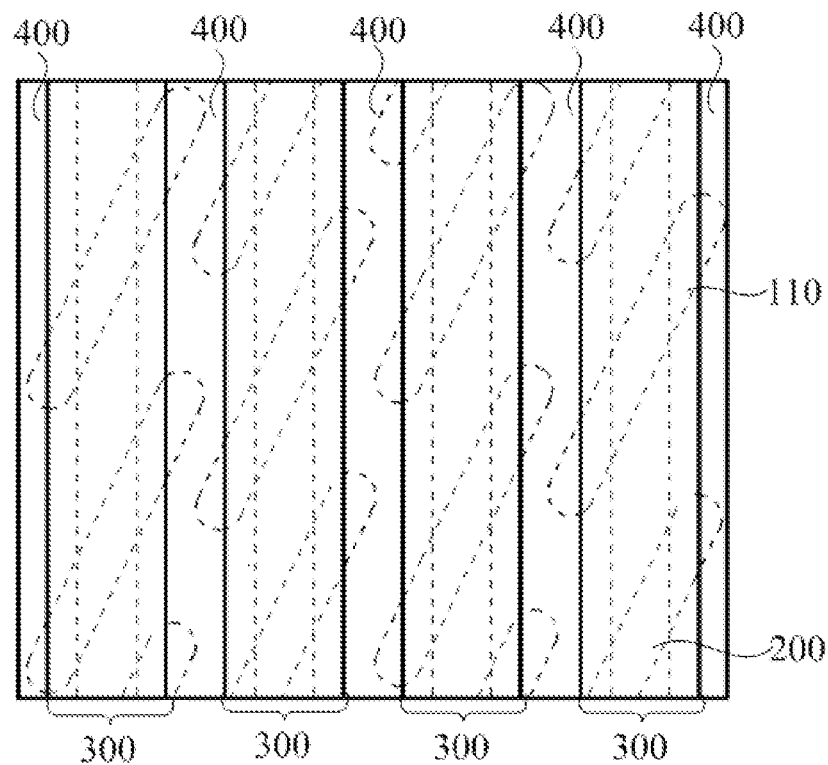
FIG. 12 is a top view after a first conductive layer is formed according to an embodiment of the present disclosure.
Figure 13:
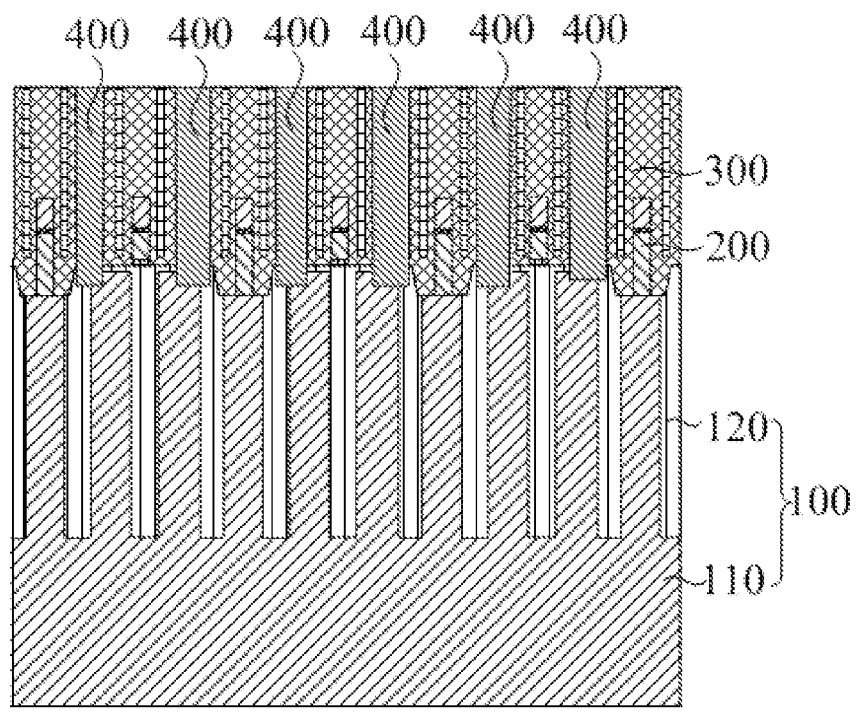
FIG. 13 is a sectional view after a first conductive layer is formed according to an embodiment of the present disclosure.
Figure 14:
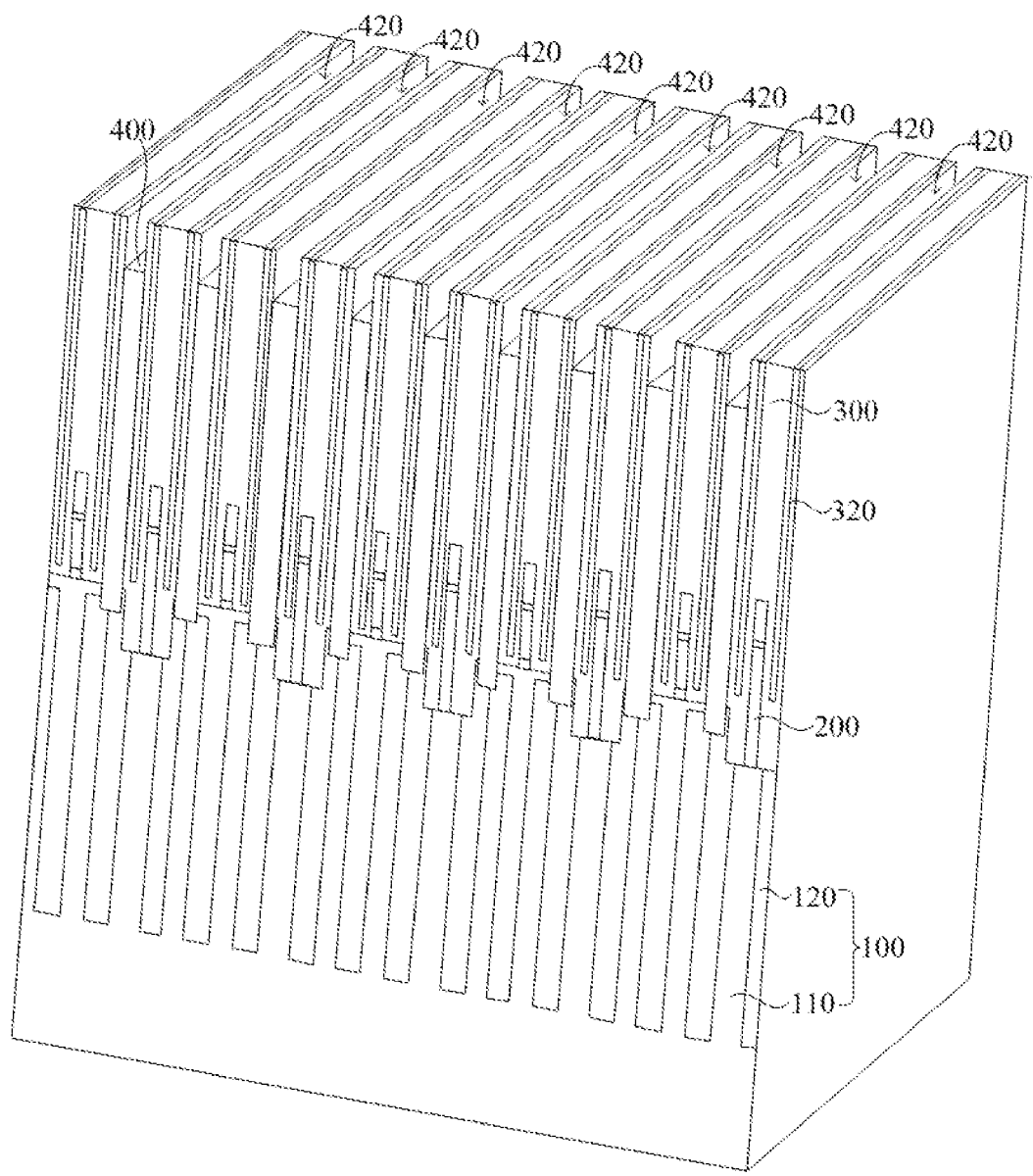
FIG. 14 is a solid diagram after third trenches are formed according to an embodiment of the present disclosure.

Referring to FIG. 11 to FIG. 13, the first conductive layer 400 is deposited in the first trenches 310 and the second trenches 130, and for example, a polycrystalline silicon layer is deposited. After the first conductive layer 400 is formed, as illustrated in FIG. 12, the first conductive layer 400 covers part of the second contact area 112 of the active area 110, so that a conducting wire is subsequently formed and is electrically connected with the active area 110.

When the first conductive layer 400 is formed, the filling space of the first trench 310 and the second trench 130 is relatively large, the filling difficulty is relatively low, the filling quality is better, a void and/or a seam generated in the first conductive layer 400 because of uneven filling is reduced, and the forming quality of the first conductive layer 400 is improved.

The first conductive layer 400 may be formed in the first trench 310 and the second trench 130 through a Chemical Vapor Deposition (CVD) process, a Physical Vapor Deposition (PVD) process, an Atomic Layer Deposition (ALD) process and other processes.

At S106, part of the first conductive layer is removed to form a plurality of first through holes, the first conductive layer is separated into a plurality of conducting wires by the plurality of first through holes, and each of the conducting wires is connected to the second contact area.

The first conductive layer 400 is etched, so as to remove part of the first conductive layer 400, the retained first conductive layer 400 and the first isolation layer 300 form the plurality of first through holes in an encircling manner, and the plurality of first through holes may be formed by a single etching.

The first conductive layer 400 is separated into the plurality of conducting wires by the plurality of first through holes, that is, the retained first conductive layer 400 forms a plurality of conducting wires disposed at intervals, each of the conducting wires is connected to a second contact area 112, so as to be electrically connected with the active area 110. Exemplarily, an active area 110 may be connected to two conducting wires, and an active area 110 may also be only connected to a conducting wire.

At S107, a second isolation layer is formed in the first through hole.

The second isolation layer may be formed through a deposition process, and the material of the second isolation layer may be an insulating material, such as Si3N4, so as to perform electric isolation on the conducting wire together with the first isolation layer 300. That is, various conducting wires are separated by the first isolation layer 300 and the second isolation layer, so as to prevent two adjacent conducting wires from being conducted, and thus normal operation of the memory is ensured.

After the second isolation layer is formed, an area formed by the first isolation layer 300 and the second isolation layer in an encircling manner is not required to be etched, so that the risk of damage to the first isolation layer 300 by etching is reduced, the through etching possibility of the first isolation layer 300 is reduced, thus, the conducting wire is prevented from being conducted with the bit line 200, and the yield of the memory is improved.

The method for manufacturing the memory provided by the embodiments of the present disclosure may include: a substrate 100 is provided at first, the substrate 100 may include a plurality of active areas 110 disposed at intervals, and the active area 110 may include a first contact area 111 and a second contact area 112; a plurality of bit lines 200 disposed at intervals are formed on the substrate 100, and each of the bit lines 200 is connected to at least one first contact area 111; first isolation layers 300 are formed on the bit line 200, and a first trench 310 extending along a first direction is formed between the two adjacent first isolation layers 300; the bottom of the first trench 310 is etched along the first trench 310 to form a second trench 130, the bottom of the second trench 130 is located in the substrate 100, and the second contact area 112 is exposed in the second trench 130; a first conductive layer 400 is formed in the first trench 310 and the second trench 130; a plurality of first through holes 520 are formed in the first conductive layer 400, the first conductive layer 400 is separated into a plurality of conducting wires 410 by the plurality of first through holes 520, and each of the conducting wires 410 is connected to a second contact area 112; and a second isolation layer 600 is formed in the first through hole 520. As the first isolation layer 300 is formed at first, the first trench 310 is formed in the first isolation layer 300, furthermore, the bottom of the first trench 310 is etched to form the second trench 130, the depth-to-width ratio of the second trench 130 is reduced, so that the loading effect of the second trench 130 is reduced, and meanwhile, the second trench 130 and the first trench 310 are aligned well, thereby improving the yield of the memory. As the first conductive layer 400 is formed in the first trench 310 and the second trench 130, the filling difficulty is relatively low. As part of the first conductive layer 400 is removed to form the plurality of first through holes 520 in the first conductive layer 400, the retained first conductive layer 400 forms the conducting wire 410, and the second isolation layer 600 is formed in the first through hole 520. Compared with the prior art that an area formed by the first isolation layer 300 and the second isolation layer 600 in an encircling manner is also required to be etched after the second isolation layer 600 is formed so as to fill the conducting wire 410, in the embodiments of the present disclosure, etching is not required again after the second isolation layer 600 is formed, so that the risk of damage to the first isolation layer 300 by etching is reduced, the through etching possibility of the first isolation layer 300 is reduced, and the yield of the memory is further improved.

It is to be noted that, referring to FIG. 14 to FIG. 18, after the step of forming the first conductive layer in the first trench and the second trench, the method for manufacturing the memory may further include the following operations.

Figure 15:
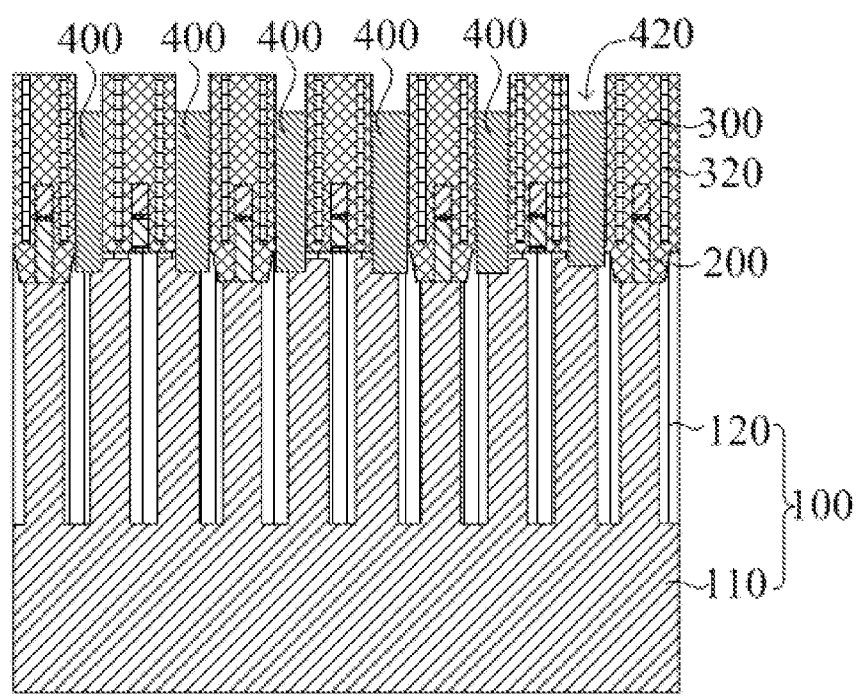
FIG. 15 is a sectional view after third trenches are formed according to an embodiment of the present disclosure.

Part of the first conductive layer is removed to form third trenches extending along a first direction. Exemplarily, referring to FIG. 14 and FIG. 15, part of the first conductive layer 400 on the first trench 310 is removed, so as to form the third trench 420, that is, the third trench 420 is a part of the first trench 310. As illustrated in FIG. 15, a side wall of the third trench 420 is the first isolation layer 300, the bottom of the third trench 420 is the first conductive layer 400, and the bottom of the third trench 420 may be located above the bit line 200.

Figure 16:
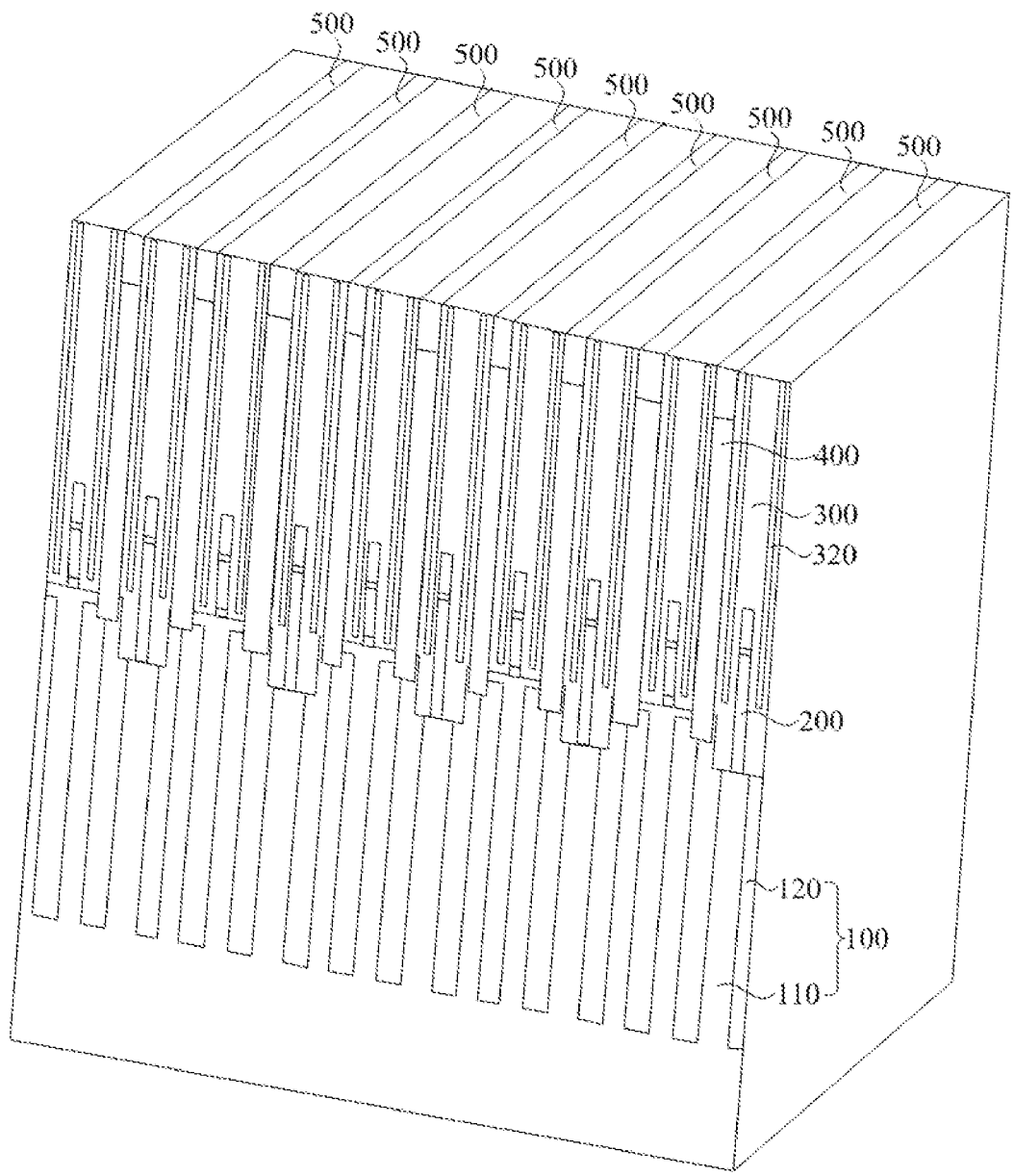
FIG. 16 is a solid diagram after an intermediate layer is formed according to an embodiment of the present disclosure.
Figure 17:
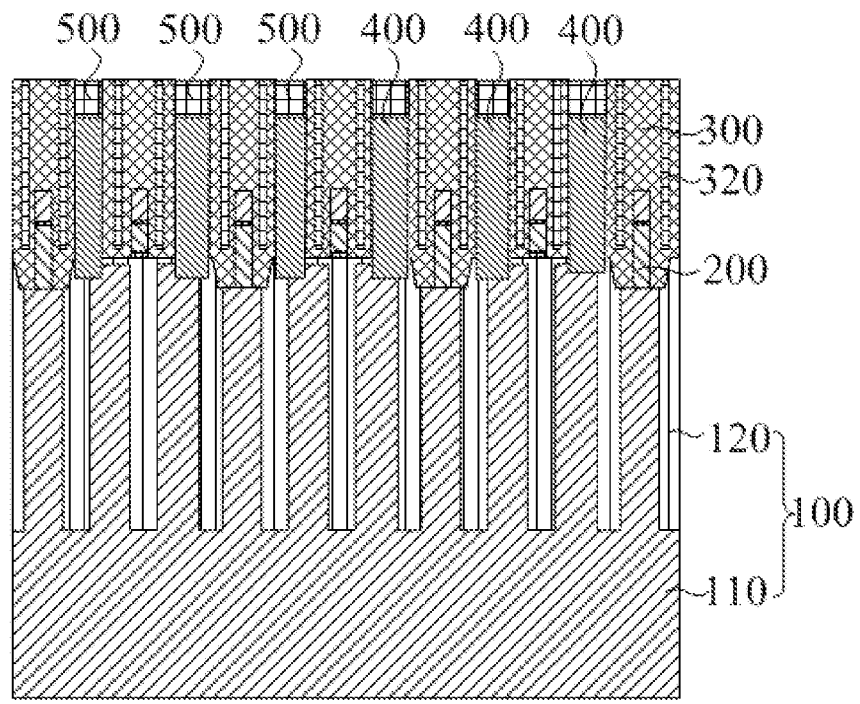
FIG. 17 is a sectional view after an intermediate layer is formed according to an embodiment of the present disclosure.

After the third trenches 420 are formed, an intermediate layer 500 is formed in the third trenches 420 and on the first isolation layer 300, and the intermediate layer 500 is filled in the third trenches 420 and covers the first conductive layer 400. Referring to FIG. 16 and FIG. 17, an upper part of the first trench 310 fills the intermediate layer 500, and a lower part of the first trench 310 fills the first conductive layer 400.

It is to be understood that, after the first conductive layer 400 is etched back to form the third trenches 420, the intermediate layer 500 is formed in the third trenches 420, on one hand, the height of the first conductive layer 400 is reduced, when the first conductive layer 400 is etched subsequently, the etching depth of the first conductive layer 400 is reduced, so that a by-product while etching is reduced, and thus the contour of the etched first conductive layer 400 is better. On the other hand, a selection ratio of the first conductive layer 400 to the first isolation layer 300 is difficult to increase, through arrangement of the intermediate layer 500, a selection ratio of the intermediate layer 500 to the first isolation layer 300 is relatively high, and the first isolation layer 300 is less etched when the intermediate layer 500 is etched subsequently. Moreover, through arrangement of the intermediate layer 500, diffusion of the first conductive layer 400 may also be stopped.

Figure 18:
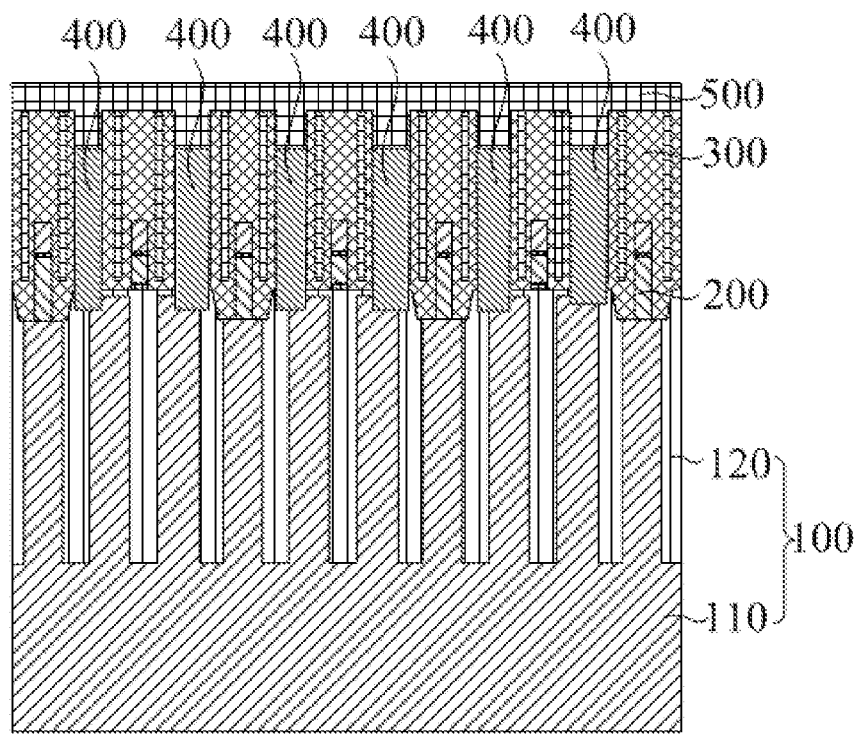
FIG. 18 is a sectional view before an intermediate layer is planarized according to an embodiment of the present disclosure.

In some possible examples, referring to FIG. 18, the intermediate layer 500 may be Spin on Dielectrics (SOD), and after a liquid insulating dielectric is spun, high-temperature processing is executed, so that the liquid insulating dielectric is solidified, thereby forming the intermediate layer 500. The intermediate layer 500 may be an oxide, such as $SiO_2$. After the intermediate layer 500 is formed, the intermediate layer 500 covers the first isolation layer 300 and the first conductive layer 400, a side, departing from the first conductive layer 400, of the intermediate layer 500 is planarized, as illustrated in FIG. 18, and an upper surface of the intermediate layer 500 is planarized.

After planarizing, the upper surface of the intermediate layer 500 exposes the first isolation layer 300 and the first conductive layer 400. The intermediate layer 500 may be planarized through Chemical Mechanical Polishing (CMP). Certainly, a planarizing mode is not limited, and for example, planarizing may also be executed through a multi-layer photoresist process.

Figures 19, 20:
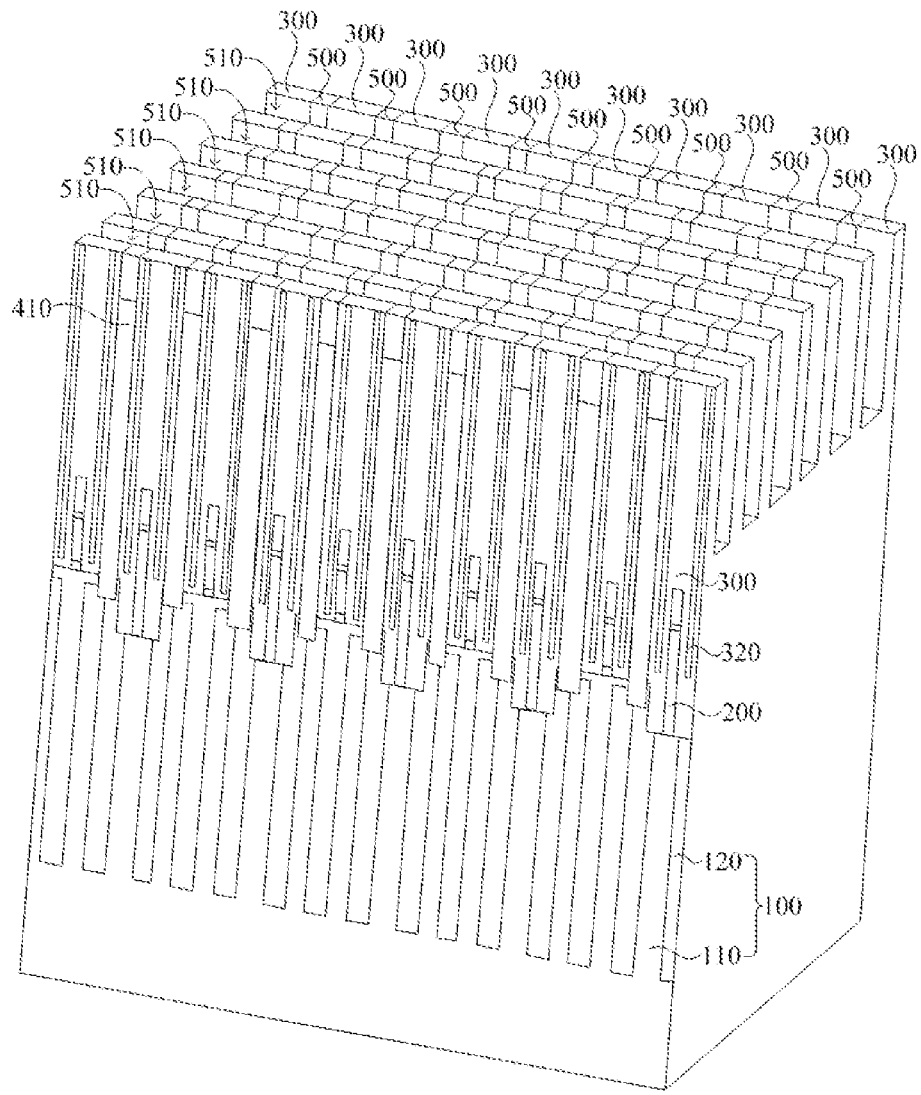
FIG. 19 is a flowchart of forming a plurality of first through holes according to an embodiment of the present disclosure.
FIG. 20 is a solid diagram after fourth trenches are formed according to an embodiment of the present disclosure.

The implementation and various implementations below are described in detail by taking the intermediate layer 500 formed in the third trench 420 as an example. Referring to FIG. 19, the operation of removing part of the first conductive layer to form the plurality of first through holes may include the following steps.

At S1061, part of the intermediate layer and part of the first isolation layer are removed to form fourth trenches extending along a second direction, and the first conductive layer and the first isolation layer are exposed in the fourth trench.

Figure 21:
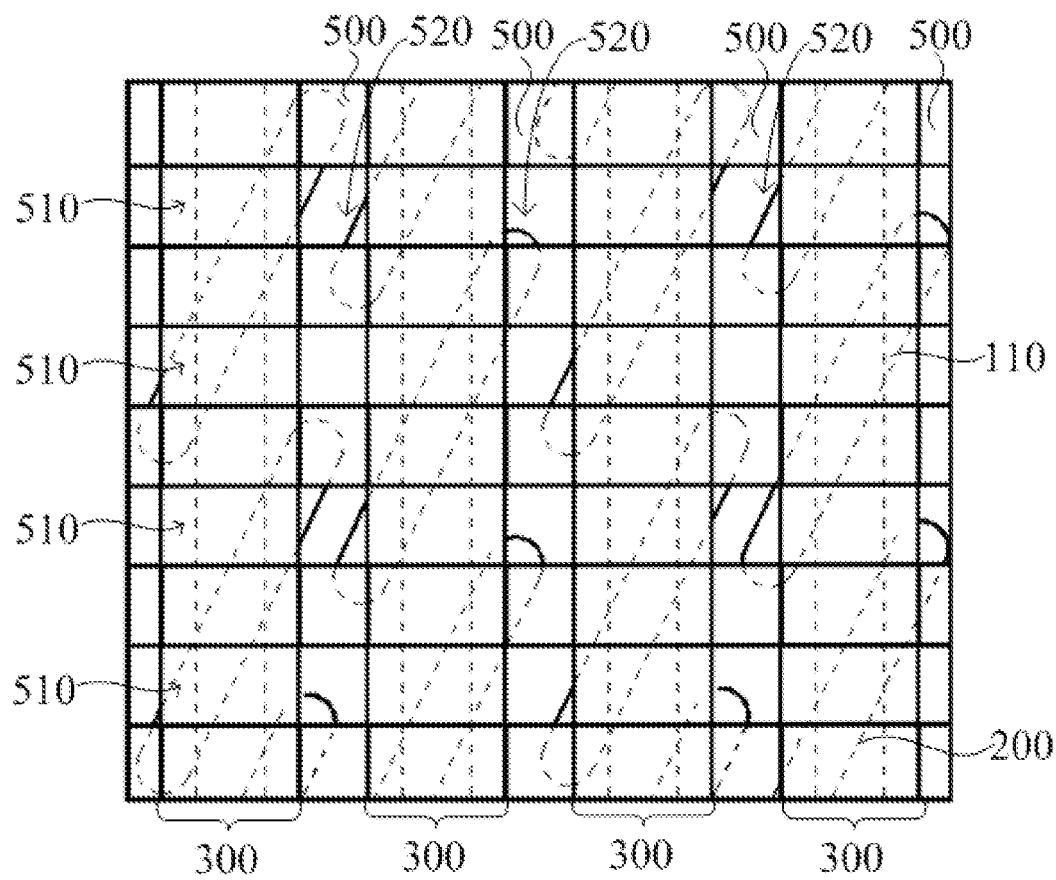
FIG. 21 is a top view after fourth trenches are formed according to an embodiment of the present disclosure.

Referring to FIG. 20 and FIG. 21, the intermediate layer 500 and the first isolation layer 300 are etched, so as to form the fourth trenches 510, the fourth trenches 510 extend along the second direction, the second direction may be perpendicular to the first direction, and, as illustrated in FIG. 21, the fourth trenches 510 are horizontally arranged, It is to be understood that, part of a side wall of the fourth trench 510 is the first isolation layer 300, part of a side wall of the fourth trench 510 is the intermediate layer 500, and the intermediate layer 500 and the first isolation layer 300 are alternate.

In a possible example, as illustrated in FIG. 20, when part of the intermediate layer 500 and part of the first isolation layer 300 are removed, part of the first conductive layer 400 is also removed, so that the bottom of the fourth trench 510 is located in the first conductive layer 400. Through the above arrangement, on one hand, the third trench 420 is easily formed, on the other hand, the height of the first conductive layer 400 is further reduced, so that the depth when the first conductive layer 400 is subsequently etched is reduced. As illustrated in FIG. 20, the bottom of the fourth trench 510 is located above the bit line 200, that is, the bit line 200 is not exposed in the fourth trench 510, so that the bit line 200 is prevented from being damaged.

At S1062, the first conductive layer located at the bottom of the fourth trench is removed to form the plurality of first through holes.

Also referring to FIG. 20 and FIG. 21, after the fourth trenches 510 are formed, the bottom of the fourth trench 510 is the first isolation layer 300 and the first conductive layer 400 that are alternate, that is, the fourth trench 510 exposes the first isolation layer 300 and the first conductive layer 400.

As illustrated in FIG. 21, the first conductive layer 400 exposed in the fourth trench 510 is removed by etching to form the plurality of first through holes 520, and retain the first conductive layer 400 below the intermediate layer 500, the retained first conductive layer 400 forms the plurality of conducting wires 410 disposed at intervals, and each of the conducting wires 410 makes contact with a second contact area 112.

Figure 22:
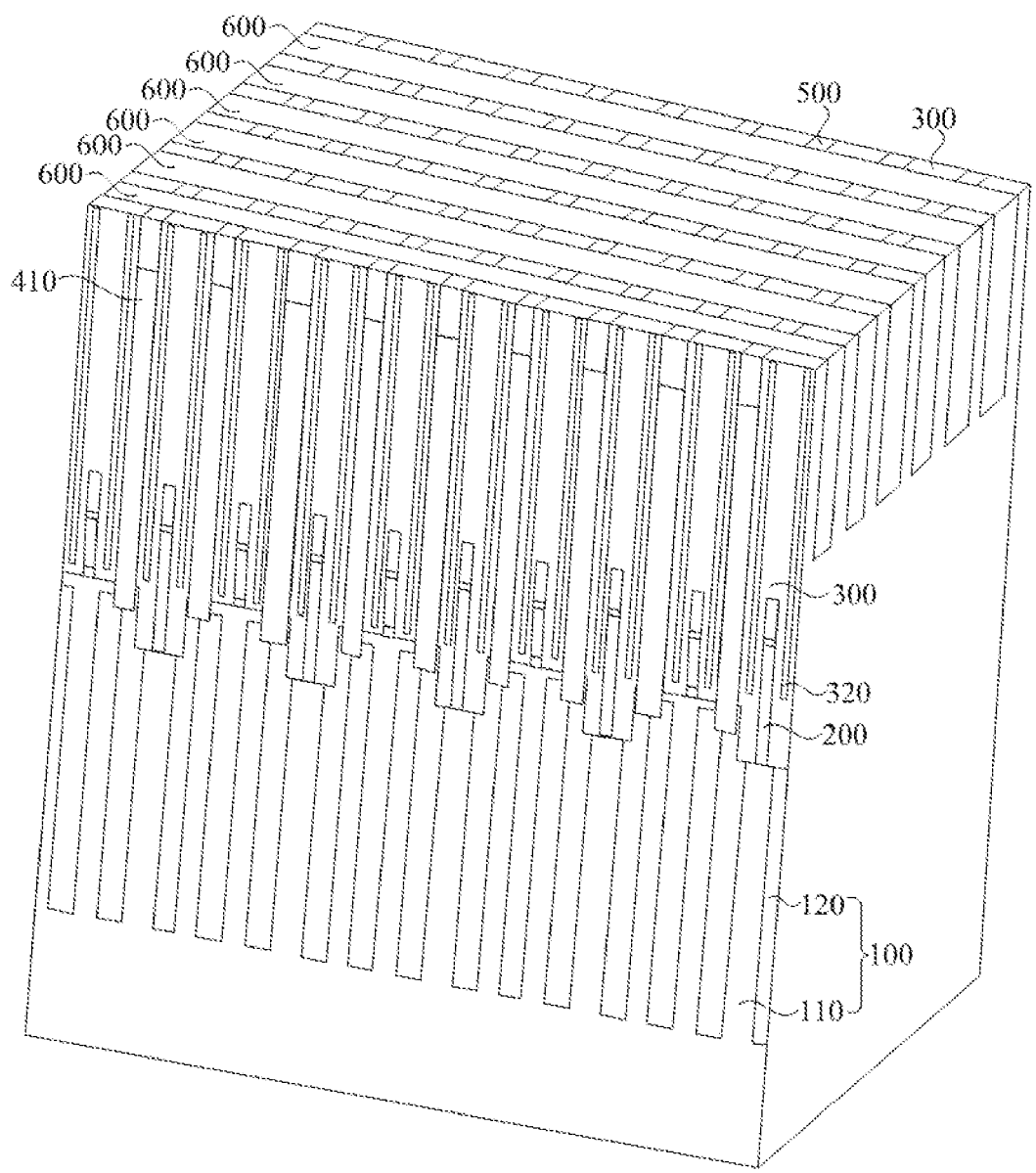
FIG. 22 is a solid diagram after a second isolation layer is formed according to an embodiment of the present disclosure.
Figure 23:
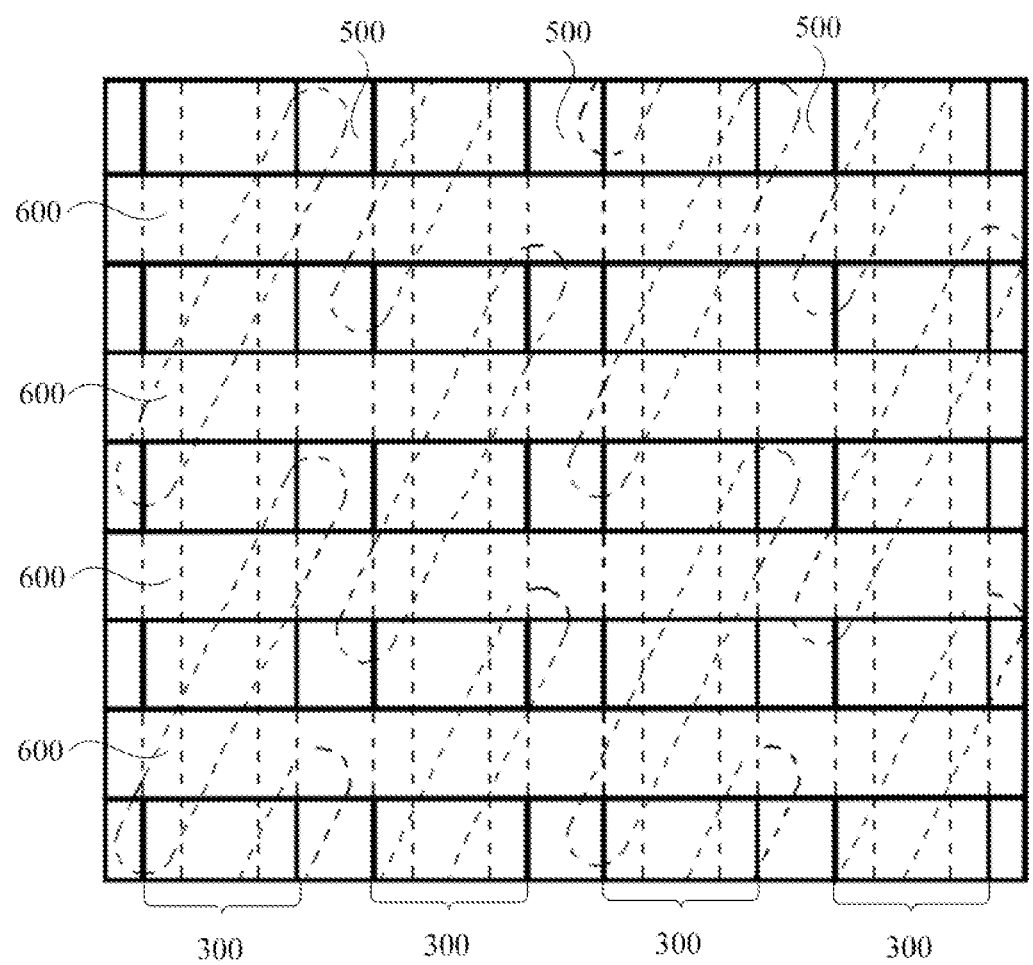
FIG. 23 is a top view after a second isolation layer is formed according to an embodiment of the present disclosure.

It is to be noted that, referring to FIG. 22 and FIG. 23, the step of forming the second isolation layer 600 in the first through hole 520 may include: the second isolation layer 600 is deposited in the first through hole 520 and the fourth trench 510, and the second isolation layer 600 is filled in the first through hole 520 and the fourth trench 510. As illustrated in FIG. 22 and FIG. 23, various conducting wires 410 are electrically isolated by the second isolation layer 600 and the first isolation layer 300.

Figure 24:
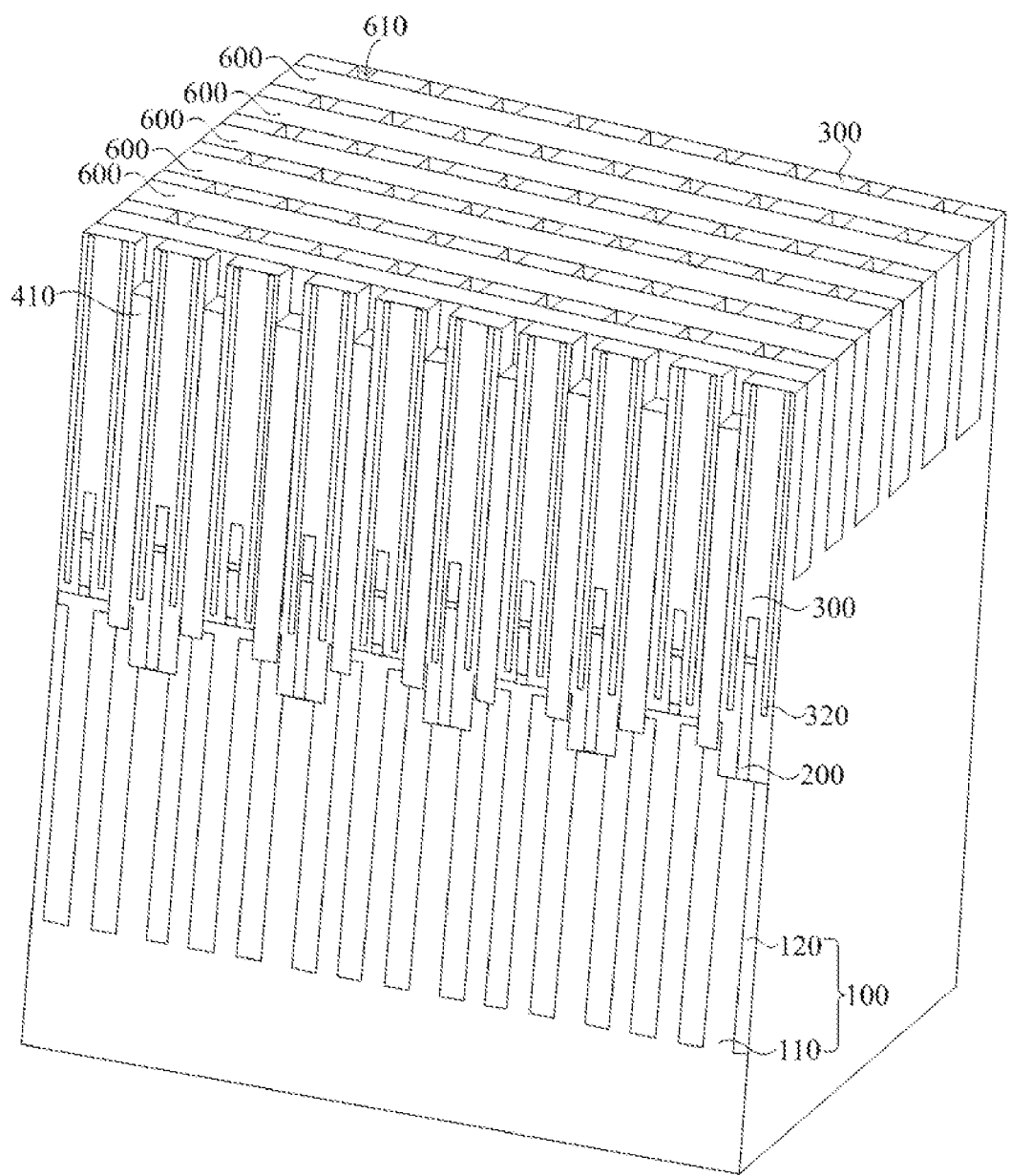
FIG. 24 is a solid diagram after an intermediate layer is removed according to an embodiment of the present disclosure.
Figure 25:
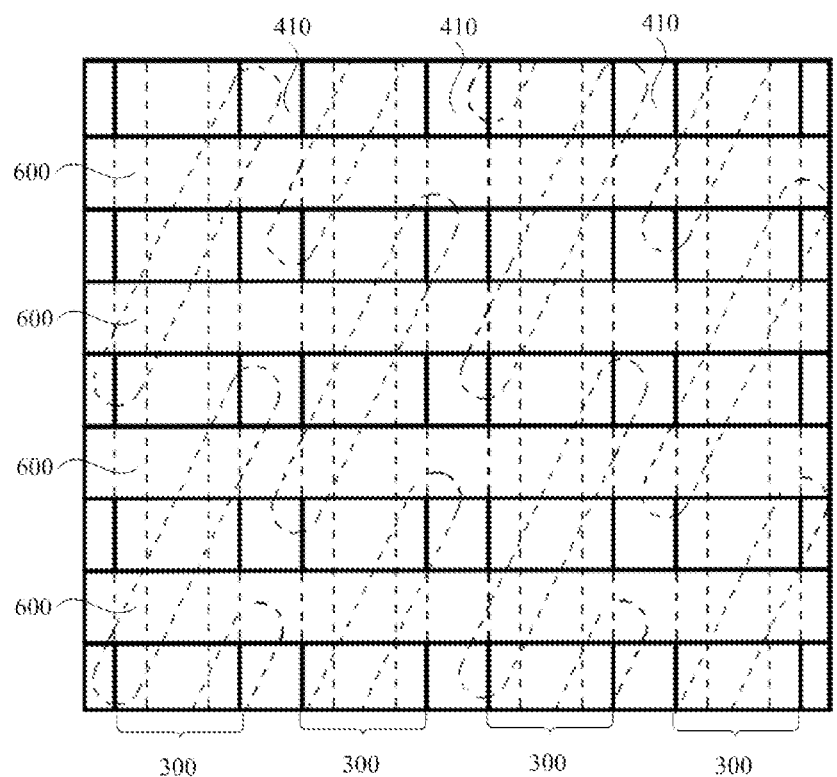
FIG. 25 is a top view after an intermediate layer is removed according to an embodiment of the present disclosure.
Figure 26:
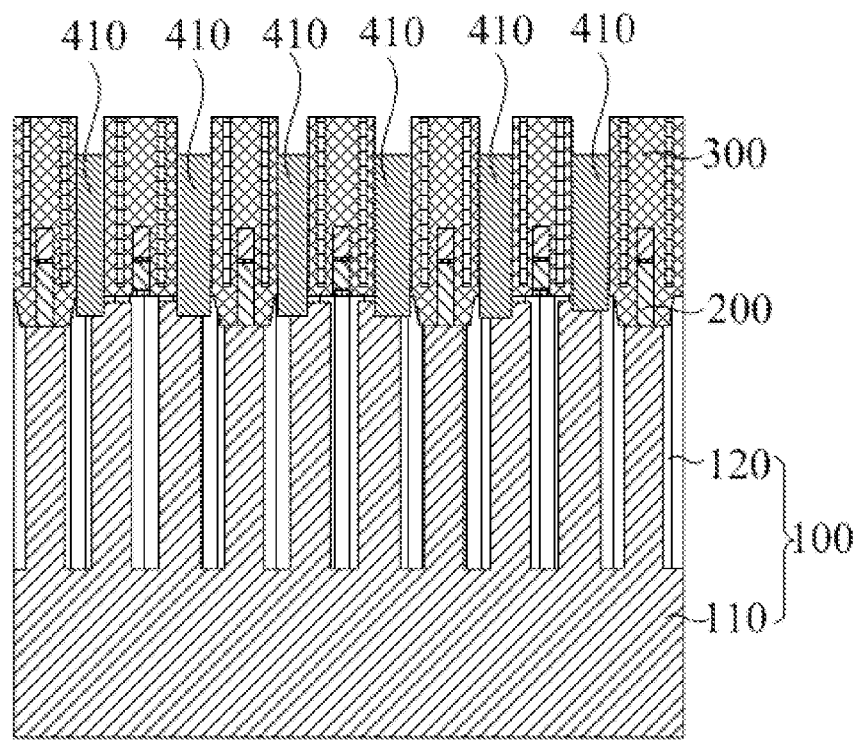
FIG. 26 is a sectional view after an intermediate layer is removed according to an embodiment of the present disclosure.

It is to be noted that, referring to FIG. 24 to FIG. 26, after the step of forming the second isolation layer 600 in the first through holes 520, the method for manufacturing the memory may further include: the intermediate layer 500 is removed to expose the conducting wires 410. Exemplarily, the intermediate layer 500 is removed through wet etching till the conducting wire 410 is exposed. As illustrated in FIG. 24, the intermediate layer is removed, so as to form a second through hole 610, and the conducting wire 410 is exposed in the second through hole 610.

When the first sacrificial layer 320 is disposed in the first isolation layer 300, the first sacrificial layer 320 is also removed while the intermediate layer 500 is removed, so that a first air gap is formed. For example, the first sacrificial layer 320 is removed through steam etching. The material of the first sacrificial layer 320 may be the same as the material of the intermediate layer 500, so that the first sacrificial layer 320 is conveniently removed by prolonging the etching time. The first sacrificial layer 320 may also be removed by etching through a high selection ratio while the first sacrificial layer 320 is etched, so that etching to other materials is reduced.

It is to be noted that, before the step of forming the second isolation layer 600 in the first through hole 520, the method for manufacturing the memory may further include: a second sacrificial layer is formed on a side surface of the conducting wire 410. The material of the second sacrificial layer may include an oxide, and for example, the second sacrificial layer is a SiO2 layer. The second sacrificial layer may be formed on each of two opposite side surfaces exposed by the conducting wire 410.

When the second sacrificial layer is formed on the side surface of the conducting wire 410, the second sacrificial layer is also removed while the intermediate layer 500 is removed, so that second air gaps are formed at both sides of the conducting wire 410. For example, the second sacrificial layer is removed by steam etching through a high selection ratio.

In a possible example, the intermediate layer 500, the first sacrificial layer 320 and the second sacrificial layer are removed by a single etching, so that the etching time is reduced. For example, the intermediate layer 500, the first sacrificial layer 320 and the second sacrificial layer are same in material, so that etching is executed conveniently.

When the first sacrificial layer 320 is etched to form the first air gaps and/or the second sacrificial layer is etched to form the second air gaps, a peripheral circuit area on the substrate 100 is also etched usually, the peripheral circuit area may generally include an insulating layer and a protection layer, the material of the insulating layer is an oxide, and the material of the protection layer is a nitride. Because the first isolation layer 300 and/or the second isolation layer 600 may not be etched when the first sacrificial layer 320 is etched and/or the second sacrificial layer is etched, the protection layer of the peripheral circuit area may not be damaged, so that failure of a peripheral circuit due to through etching of the insulating layer of the peripheral circuit area is avoided.

The method for manufacturing the memory provided by the embodiments of the present disclosure has the following advantages.

The method for manufacturing the memory provided by the embodiments of the present disclosure may include: a substrate is provided at first, the substrate may include a plurality of active areas disposed at intervals, and the active area may include a first contact area and second contact areas; a plurality of bit lines disposed at intervals are formed on the substrate, and each of the bit lines is connected to at least one first contact area; first isolation layers are formed on the bit line, and a first trench extending along a first direction is formed between the two adjacent first isolation layers; the bottom of the first trench is etched along the first trench to form a second trench, the bottom of the second trench is located in the substrate, and the second contact area is exposed in the second trench; a first conductive layer is formed in the first trench and the second trench; part of the first conductive layer is removed to form a plurality of first through holes, the first conductive layer is separated into a plurality of conducting wires by the plurality of first through holes, and each of the conducting wires is connected to a second contact area; and a second isolation layer is formed in the first through hole. As the first isolation layer is formed at first, the first trench is formed in the first isolation layer, furthermore, the bottom of the first trench is etched to form the second trench, the depth-to-width ratio of the second trench is reduced, so that the loading effect of the second trench is reduced, and meanwhile, the second trench and the first trench are aligned well, thereby improving the yield of the memory. As the first conductive layer is formed in the first trench and the second trench, the filling difficulty is relatively low, so as to improve the yield of the memory. As part of the first conductive layer is removed to form the plurality of first through holes in the first conductive layer, the retained first conductive layer forms the conducting wire, and the second isolation layer is formed in the first through hole. Compared with the prior art that an area formed by the first isolation layer and the second isolation layer in an encircling manner is also required to be etched so as to fill the conducting wire, in the embodiments of the present disclosure, etching is not required again after the second isolation layer is formed, so that the risk of damage to the first isolation layer by etching is reduced, the through etching possibility of the first isolation layer is reduced, and the yield of the memory is further improved.

Various embodiments or implementations in the specification are described in a progressive way, each of the embodiments focuses on the differences from other embodiments, and same and similar parts among various embodiments may be referred to each other.

It is to be understood by those skilled in the art that, in the disclosure of the present disclosure, orientation or position relationships indicated by terms "longitudinal", "transverse", "upper", "lower", "front", "back", "left", "right", "vertical", "horizontal", "top", "bottom", "inner", "outer" and the like are orientation or position relationships illustrated in the drawings, are adopted not to indicate or imply that indicated systems or components must be in specific orientations or structured and operated in specific orientations but only to conveniently describe the present disclosure and simplify descriptions and thus should not be understood as limits to the present disclosure.

In description of the specification, description of referring terms such as "one implementation", "some implementations", "a schematic implementation", "a demonstration", "a specific demonstration", or "some demonstrations" refers to specific features, structures, materials or features described in combination with the implementations or demonstrations involved in at least one implementation or demonstration of the present disclosure. In the specification, schematic description on the above terms not always refers to same embodiment modes or demonstrations. Moreover, the described specific features, structures, materials or features may be combined in any one or more implementations or demonstrations in a proper manner.

Finally, it is to be noted that the above various embodiments are only used to illustrate the technical solutions of the present disclosure, and are not limited thereto. Although the present disclosure has been described in detail with reference to the foregoing various embodiments, those skilled in the art should understand that the technical solutions described in the foregoing various embodiments still may be modified, or part or all technical features are equivalently replaced, but the modifications and replacements do not make the essence of the corresponding technical solutions depart from the scope of the technical solutions of various embodiments of the present disclosure.

The invention claimed is:

1. A method for manufacturing a memory, comprising:
   providing a substrate, the substrate comprising a plurality of active areas disposed at intervals, and each active area comprising a first contact area and second contact areas;
   forming a plurality of bit lines disposed at intervals on the substrate, each of the bit lines being connected to at least one first contact area;
   forming first isolation layers on the respective bit lines, and forming a first trench extending along a first direction between two adjacent first isolation layers;
   etching bottom of the first trench along the first trench to form a second trench, wherein the bottom of the second trench is located in the substrate, and the second contact area is exposed in the second trench;
   forming a first conductive layer in the first trench and the second trench;
   removing part of the first conductive layer to form third trenches extending along a first direction; and
   forming an intermediate layer in the third trenches and on the first isolation layer, the intermediate layer being filled in the third trenches and covering the first conductive layer;
   removing part of the first conductive layer to form a plurality of first through holes, comprising:
   removing part of the intermediate layer and part of the first isolation layer to form fourth trenches extending along a second direction, the first conductive layer and the first isolation layer being exposed in the fourth trenches;
   removing the first conductive layer located at bottom of the fourth trenches to form the plurality of first through holes, wherein the first conductive layer is separated into a plurality of conducting wires by the plurality of first through holes, and each of the conducting wires is connected to a respective second contact area; and
   forming a second isolation layer in the first through hole.

2. The method for manufacturing the memory of claim 1, wherein
   the step of removing part of the first conductive layer to form the third trenches extending along the first direction comprises:
   removing part of the first conductive layer located on the first trenches, so as to form the third trenches.

3. The method for manufacturing the memory of claim 1, wherein
   bottom of the third trench is located above the bit line.

4. The method for manufacturing the memory of claim 1, wherein after the step of forming the intermediate layer in the third trenches and on the first isolation layer, the method further comprises: planarizing a side, departing from the first isolation layer, of the intermediate layer.

5. The method for manufacturing the memory of claim 1, wherein the second direction is perpendicular to the first direction.

6. The method for manufacturing the memory of claim 1, wherein the step of removing part of the intermediate layer and part of the first isolation layer further comprises: removing part of the first conductive layer, so that the bottom of the fourth trenches is located in the first conductive layer.

7. The method for manufacturing the memory of claim 1, wherein the step of forming the second isolation layer in the first through holes comprises:

depositing the second isolation layer in the first through holes and the fourth trenches, the second isolation layer being filled in the first through holes and the fourth trenches.

8. The method for manufacturing the memory of claim 1, wherein after the step of forming the second isolation layer in the first through holes, the method further comprises: removing the intermediate layer to expose the conducting wires.

9. The method for manufacturing the memory of claim 1, wherein the material of the first conductive layer comprises polycrystalline silicon, and the material of the first isolation layer and the second isolation layer comprises silicon nitride.

10. The method for manufacturing the memory of claim 8, wherein the first isolation layer covers the bit lines and the substrate; and the step of etching the bottom of the first trenches along the first trenches comprises:

etching the first isolation layer and the substrate along the first trenches to form the second trenches.

11. The method for manufacturing the memory of claim 10, wherein a plurality of first sacrificial layers extending along the first direction are disposed in the first isolation layer, and both sides of each of the bit lines are provided with the first sacrificial layer; and the step of etching the first isolation layer and the substrate along the first trenches further comprises: removing part of the first isolation layer, so that the first sacrificial layer is exposed from a surface, away from the substrate, of the first isolation layer.

12. The method for manufacturing the memory of claim 11, wherein the step of removing the intermediate layer further comprises:

removing the first sacrificial layer to form first air gaps.

13. The method for manufacturing the memory of claim 12, wherein the first sacrificial layer is removed through steam etching.

14. The method for manufacturing the memory of claim 11, wherein before the step of forming the second isolation layer in the first through holes, the method further comprises: forming a second sacrificial layer on side surfaces of the conducting wires.

15. The method for manufacturing the memory of claim 14, wherein the step of removing the intermediate layer further comprises: removing the first sacrificial layer and the second sacrificial layer to form a second air gaps.

16. The method for manufacturing the memory of claim 15, wherein the first sacrificial layer, the second sacrificial layer and the intermediate layer are removed by a single etching.

17. The method for manufacturing the memory of claim 15, wherein the material of the first sacrificial layer, the second sacrificial layer and the intermediate layer comprises an oxide, and the intermediate layer is Spin on Dielectrics (SOD).

* * * * *